United States Patent [19]

Kasashima et al.

[11] Patent Number: 5,712,708
[45] Date of Patent: Jan. 27, 1998

[54] ALIGNER FOR TIMING THE ALIGNMENT OF A WAFER AND MASK WITH A SHUTTER TO PROTECT THE WAFER DURING ALIGNMENT

[75] Inventors: Takashi Kasashima; Hitoshi Shimizu, both of Kagoshima, Japan

[73] Assignee: Sony Corporation, Japan

[21] Appl. No.: 681,521

[22] Filed: Jul. 23, 1996

[30] Foreign Application Priority Data

Jul. 28, 1995 [JP] Japan ................... 7-212600

[51] Int. Cl.⁶ ................................. G01B 11/00
[52] U.S. Cl. ........................... 356/401; 355/53
[58] Field of Search ............. 355/53, 55; 356/399, 356/400, 401

[56] References Cited

U.S. PATENT DOCUMENTS 4,624,551  11/1986  Anzai et al. ................. 355/53

Primary Examiner—Frank G. Font
Assistant Examiner—Robert Kim
Attorney, Agent, or Firm—Ronald P. Kananen

[57] ABSTRACT

A 1:1 projection aligner includes a first optical system for irradiating a light beam, emitted from a light source, on a wafer through a mask; and a second optical system for irradiating a light beam, emitted from the same light source, as that of the first optical system for auto-alignment of the wafer. The aligner further includes a timer for measuring an elapsed time and outputting a signal after a specified time has elapsed, first and second shutters for shielding light paths of light beams from the first and second optical systems, and drive units for driving the shutters on the basis of a signal from the timer. In the case of a failure of the auto-alignment operation, the shutters are closed for preventing the wafer from being irradiated with a light beam for a long time, thereby preventing generation of a defect such as unevenness of exposure. An alarm is also outputted for informing an operator of the failure of the auto-alignment.

14 Claims, 6 Drawing Sheets

5,712,708

ALIGNER FOR TIMING THE ALIGNMENT OF A WAFER AND MASK WITH A SHUTTER TO PROTECT THE WAFER DURING ALIGNMENT

BACKGROUND OF THE INVENTION

The present invention relates to an aligner, and particularly to an aligner capable of preventing unevenness of exposure.

Various kinds of aligners have been used for fabrication of semiconductor devices. Here, the configuration of related art aligners will be described by example of a 1:1 projection aligner. In general, the 1:1 projection aligner exposes a photoresist film on a wafer by projecting and imaging a full-scale mask pattern on the photoresist film on the wafer at a magnification of 1:1 using a mirror projection system composed of a combination of a convex mirror and a concave mirror and a 1:1 mask. Unlike a contact aligner, the 1:1 projection aligner is free from defects due to contact between the wafer and the mask because the mask is completely separated from the wafer.

The configuration of a portion, near a light source, of the related art 1:1 projection aligner will be described by example of a high performance condenser system with reference to FIG. 4. An optical system of the 1:1 projection aligner includes a first optical system 14 for irradiating a light beam emitted from a light source 12 on a wafer through a mask, and a second optical system 16 for auto-alignment of the wafer.

In the first optical system 14, a light beam emitted from the light source 12, for example, a mercury lamp travels to a concave mirror 20 by way of a first condenser lens 18. The light, being reflected from the concave mirror 20, travels to a convex mirror 22 formed integrally with the condenser lens 18 in such a manner as to be adjacent thereto. The light beam reflected from the convex lens 22 travels to a plane mirror 24, being changed in its light path at the plane mirror 24, and reaches a wafer (not shown) by way of a mask (not shown) to expose a photoresist film on the wafer.

The second optical system 16 is used for auto-alignment between a wafer and a mask by moving the wafer through operation of a wafer stage and detecting optical overlapping of an alignment mark of the mask on an alignment mark of the wafer. The second optical system 16 allows part of a light beam emitted from the same light source as that of the first optical system 14 to transmit a second condenser lens 26 of the second optical system 16 and to be irradiated to an auto-alignment lens (not shown).

The principle of the auto-alignment operation will be described by an example from a reference ("Design and Fabrication of LSI" issued by Denki Shoin, PP. 240). As shown in FIG. 5A, wafer marks, which serve as alignment marks, are provided on a wafer for each chip (one enlarged wafer mark is shown in FIG. 5B). On the other hand, as shown in FIG. 6A, mask marks as alignment marks are provided on a mask for each chip area (one enlarged mask mark is shown in FIG. 6B).

Upon auto-alignment, the wafer is moved such that a mask mark is overlapped on the corresponding wafer mask, and a light beam is allowed to scan the overlapped marks at a constant speed as shown in FIG. 7A, to detect six pulses of light scattered from the overlapped marks. The position of the wafer is automatically adjusted such that the positional detection signals are arranged at equal intervals shown in FIG. 7B. Such operations are simultaneously performed for marks on an arbitrarily selected two chips disposed near both the ends of the wafer, to thus perform auto-alignment of the wafer.

However, in a control program for controlling an auto-alignment function of the 1:1 projection aligner, an maximum number of times the auto-alignment operation is preferred for each wafer by the projection aligner is specified for restricting the auto-alignment operation so as not to be repeated over the maximum number.

In the 1:1 projection aligner, however, the above restriction is insufficient to cope with the following problems:

The first problem is that in the case where a scattered light or reflected light from an alignment mark has a poor waveform, it is difficult to detect the scattered light or reflected light. Thus, the alignment between the wafer and the mask is difficult to attain even if the auto-alignment operation is repeated over the allowable number. In this case, since the wafer usually receives light from the first optical system during auto-alignment operation, a photoresist film on the wafer is affected by the light beam, tending to cause a defect such as unevenness of exposure. The unevenness of exposure becomes important with the trend to high integration of semiconductor devices.

The second problem is that since the 1:1 projection aligner cannot inform an operator of the stopping of the auto-alignment operation after it is repeated the allowed number of times, the operator cannot recognize a failure of auto-alignment for a long time, resulting in the waste of time.

The third problem is that since a light beam is irradiated for a long time, parts and portions of the 1:1 projection aligner that are irradiated with the light beam are damaged by the thermal energy of the light beam and ultraviolet rays, resulting in reduced service life.

The above-described problems are not limited to the 1:1 projection aligner, but are common to various aligners including the 1:1 projection aligner.

SUMMARY OF THE INVENTION

An object of the present invention is to provide an aligner including a means for preventing generation of uneven exposure to a wafer in the case of failure of the auto-alignment and an alarm system for outputting an alarm to inform an operator of the failure of the auto-alignment.

To achieve the above object, according to a preferred mode of the present invention, there is provided an aligner including: a first optical system for irradiating a light beam emitted from a light source to a wafer by way of a mask so as to expose a photoresist film on the wafer; a means for auto-alignment of the wafer; a timer for measuring an elapsed time since the start of auto-alignment and outputting a signal after an elapse of a specified time; a shutter for shielding a light path of the first optical system; and a drive unit for driving the shutter on the basis of a signal supplied from the timer.

Examples of the auto-alignment means, being not particularly limited, may include various known types. The aligner of the present invention has the feature that the shutter shields the light path of the first optical system irrespective of the repeated number of auto-alignment operations after a specified time previously inputted in the timer has elapsed. This is advantageous in that a wafer is prevented from being irradiated with a light beam for a long time unlike the related art aligner. This prevents generation of a failure of exposure such as unevenness of exposure.

In the aligner of the present invention, the auto-alignment means may includes a second optical system for irradiating a light beam emitted from the light source to the wafer so as to allow the light beam to scan an alignment mark provided on the wafer, and a shutter for shielding a light path of the second optical system and a drive unit for driving the shutter.

Examples of the shutters, being not particularly limited, may include a diaphragm type shutter used for a camera or a plate type shutter. Moreover, a mechanical means using a hydraulic cylinder and a link mechanism may be used as the means for operating the shutter. The light source of the first optical system may be the same as that of the second optical system or different therefrom. The first and second optical systems may be respectively shielded by two shutters or may be shielded by one shutter.

The aligner of the present invention may further includes an alarm system for outputting at least one of an acoustic alarm and a visual alarm on the basis of a signal supplied from the timer. The acoustic alarm means an alarm sound generated from a buzzer or the like, and the visual alarm means lighting or flashing of a lamp. The alarm allows an operator to directly recognize a failure of auto-alignment and to start working to eliminate the cause of the failure, thereby improving the efficiency of the exposure step.

The aligner of the present invention may further includes a reset means for opening the shutters by reset thereof. Since the shutters are opened by the reset means, the process flow can be returned to the exposure step directly after eliminating the cause of the failure of auto-alignment. This improves the efficiency of the exposure step.

DETAILED DESCRIPTION OF THE PREFERRED EMBODIMENT

Hereinafter, an embodiment of the present invention will be described with reference to the accompanying drawings.

Figure 1:
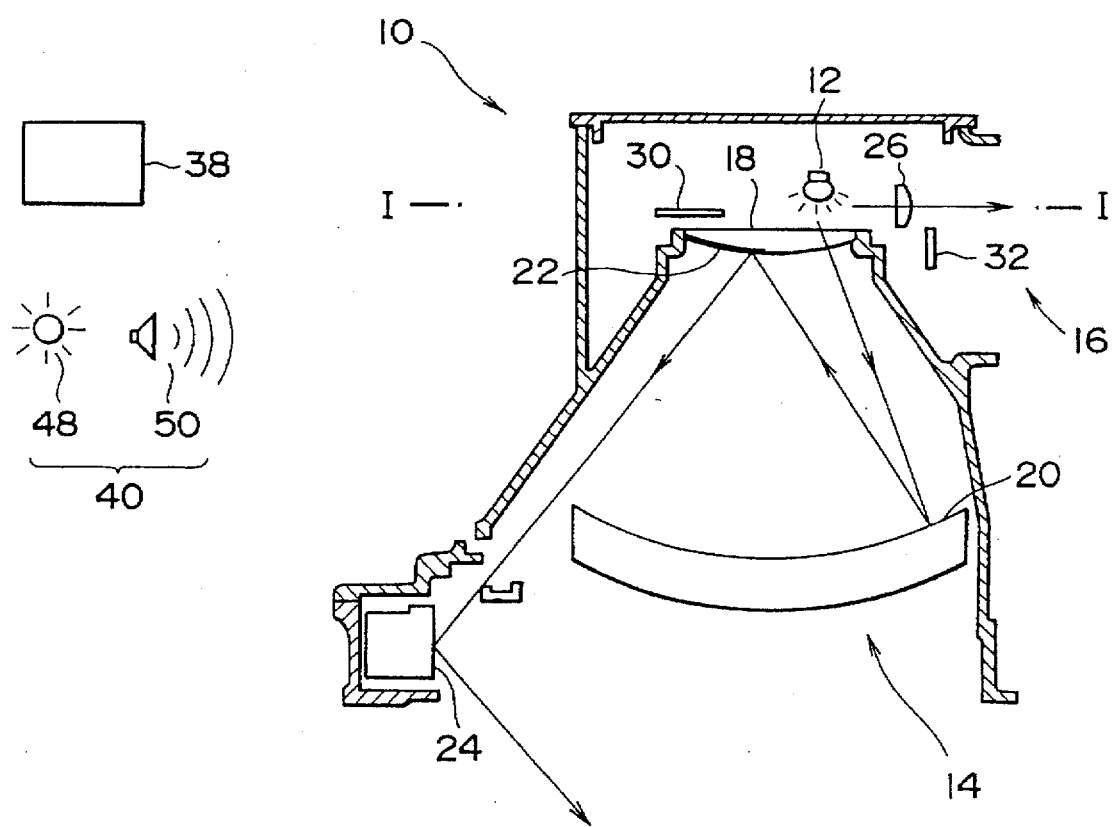
FIG. 1 is a typical view showing the configuration of an essential portion of an embodiment of an aligner of the present invention.
Figure 2:
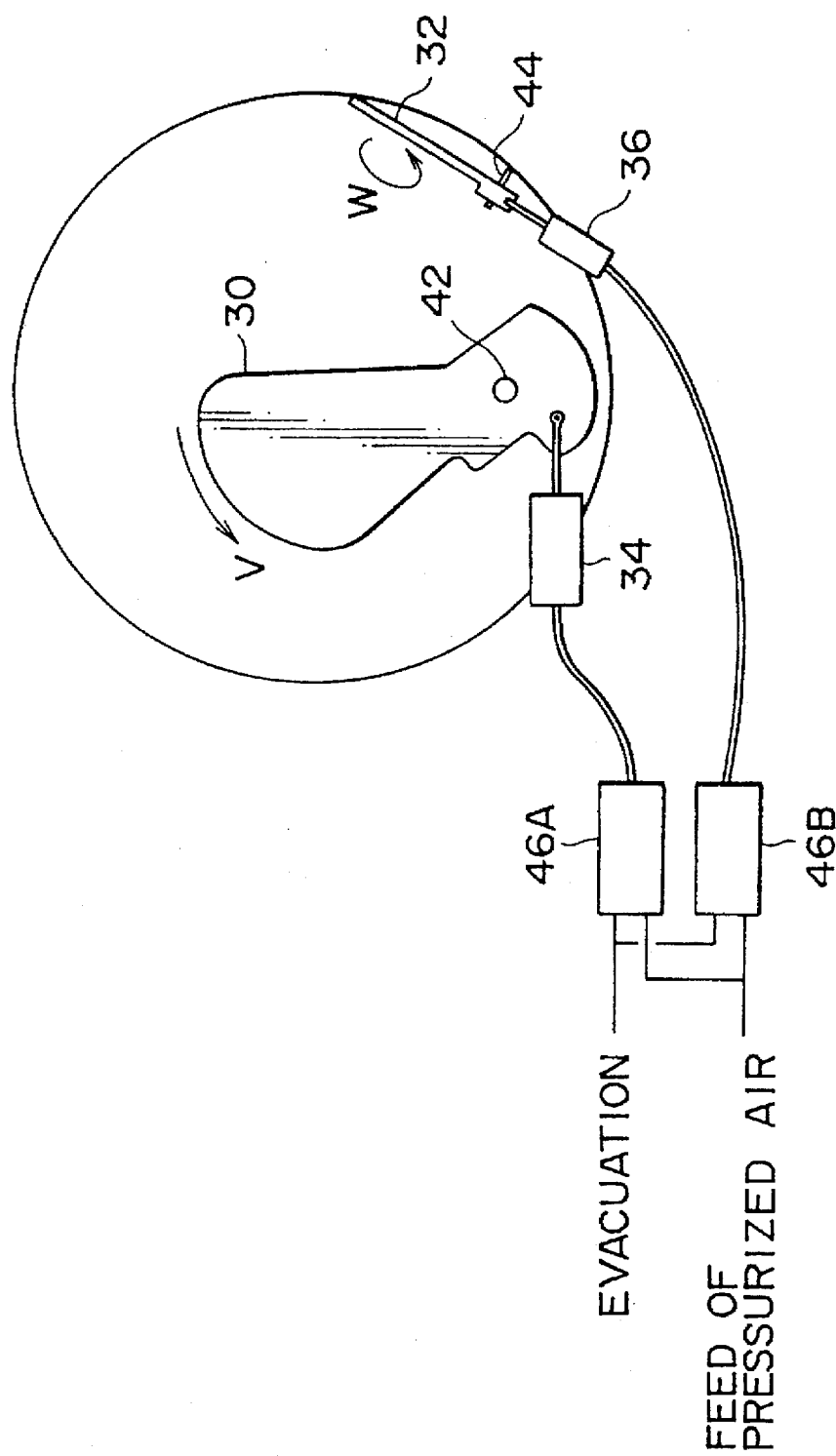
FIG. 2 is a typical plan view, seen from line I—I of FIG. 1, illustrating shutters provided in the aligner shown in FIG. 1.
Figure 3:
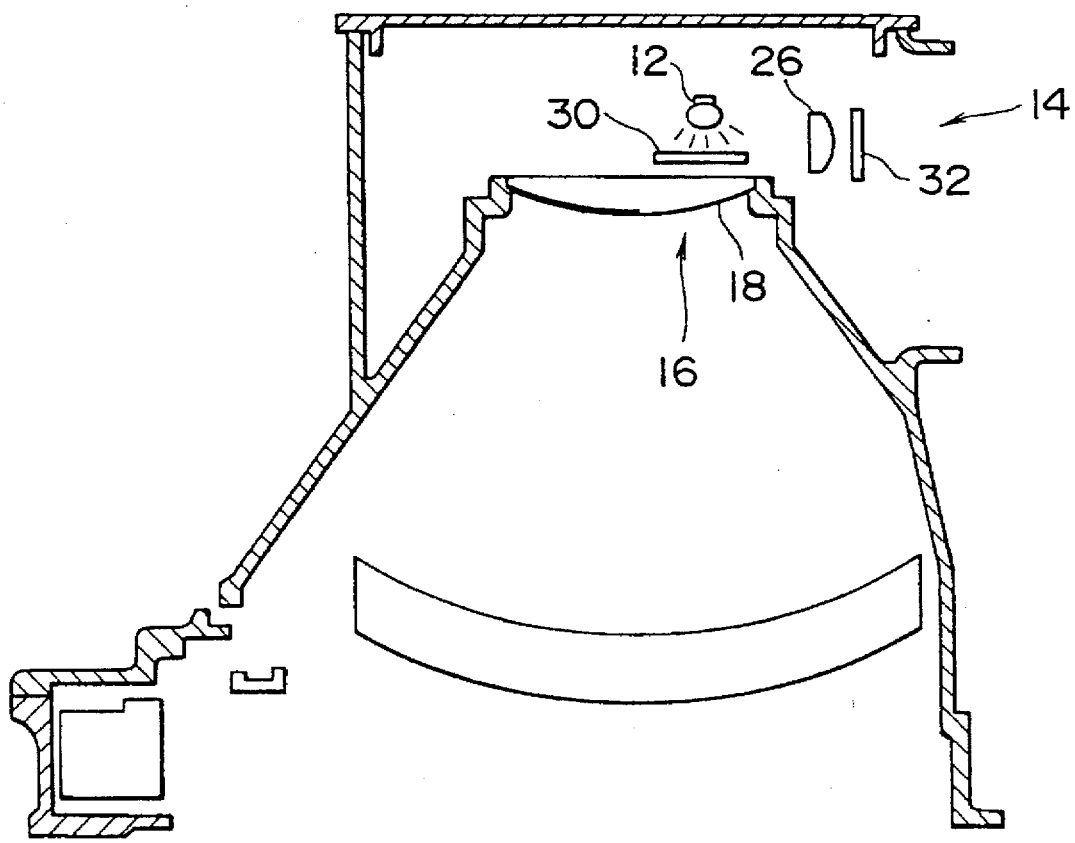
FIG. 3 is a typical view showing a state in which shutters shield light paths of light beams.

FIG. 1 is a typical view showing the configuration of an essential portion of an embodiment of an aligner of the present invention; FIG. 2 is a typical plan view, seen from line I—I of FIG. 1, illustrating shutters provided in the aligner shown in FIG. 1; and FIG. 3 is a typical view showing a state in which the shutters shield light paths of light beams.

Figure 4:
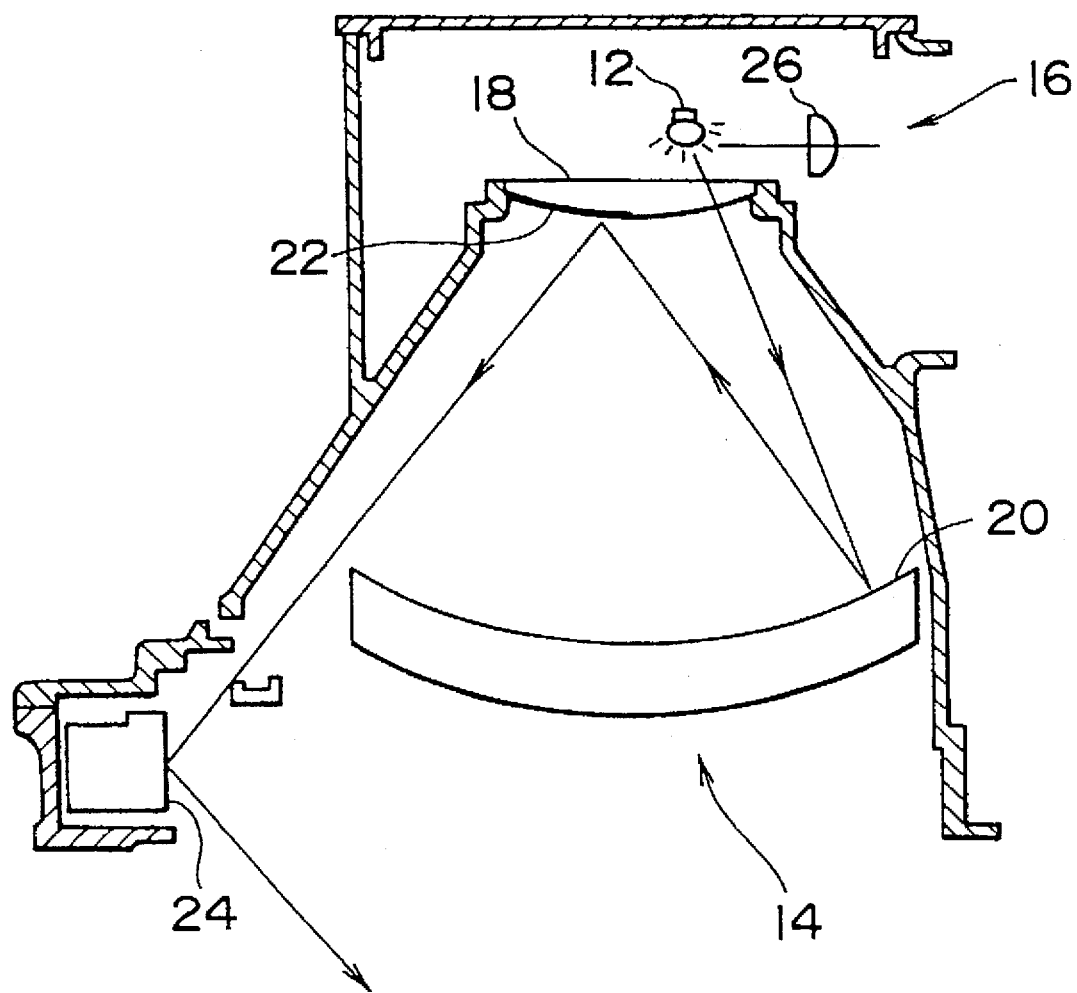
FIG. 4 is a typical view showing the configuration of an essential portion of a related art 1:1 projection aligner.
Figure 5A:
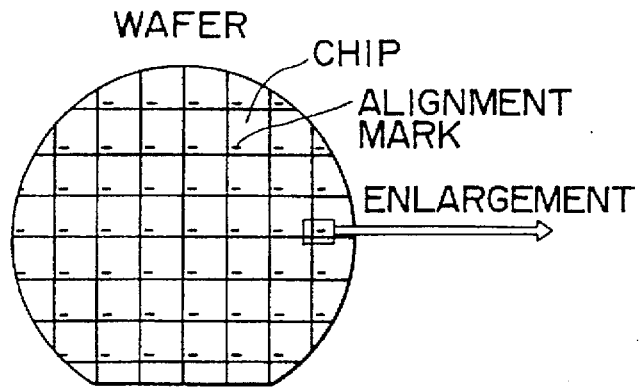
FIG. 5A is a view showing alignment marks provided on a wafer for each chip.
Figure 5B:
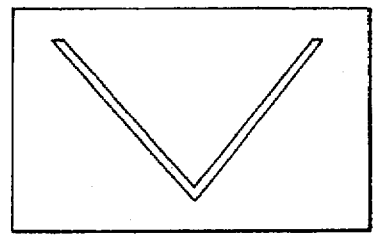
FIG. 5B is an enlarged view of one alignment mark shown in FIG. 5A.
Figure 6A:
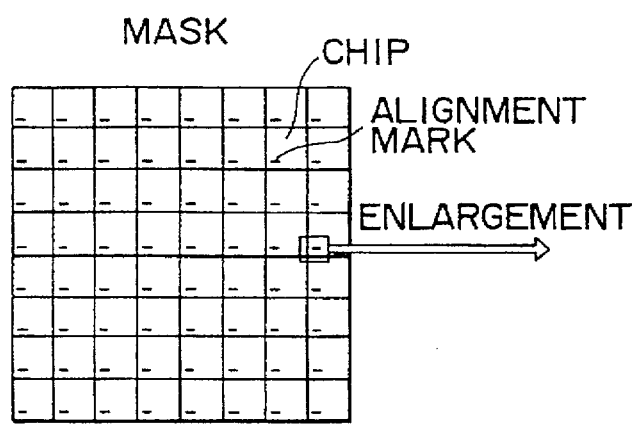
FIG. 6A is a view showing alignment marks provided on a mask for each chip area.
Figure 6B:
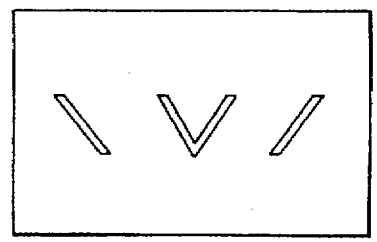
FIG. 6B is an enlarged view of one alignment mark shown in FIG. 6A.
Figure 7A:
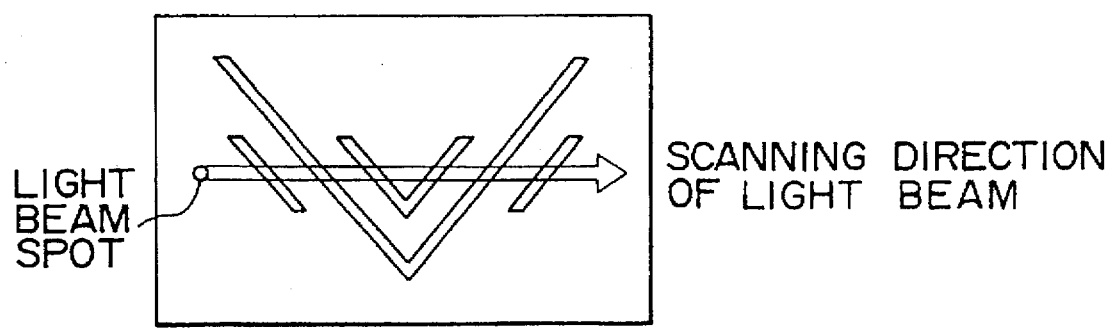
FIG. 7A is a view showing a state in which a light beam scans overlapped marks.
Figure 7B:
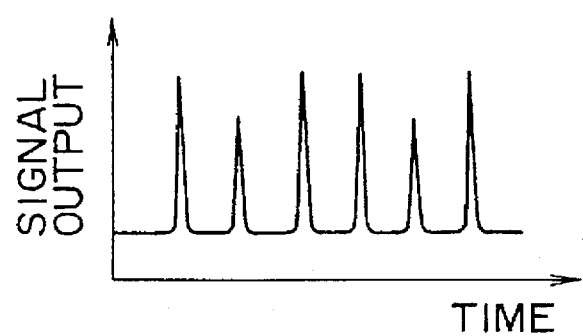
FIG. 7B is a diagram showing detection signals indicating pulses of light scattered from the marks.

A 1:1 projection aligner 10 of the present invention shown in FIGS. 1, 2 includes, in addition to the configuration shown in FIG. 4, a first shutter 30 for shielding a light path of a light beam from a first optical system 14, a second shutter 32 for shielding a light path of a light beam from a second optical system 16, a first pneumatic cylinder 34 for driving the first shutter 30, a second pneumatic cylinder 36 for driving the second shutter 32, a controller 38 for controlling operation of the first and second pneumatic cylinders 34, 36, an alarm system 40, and a reset means (not shown).

The first shutter 30 is composed of a sector plate, which is provided for shielding a light path of a light beam between a light source 12 and a first condenser lens 18. As shown in FIG. 2, the first shutter 30 turns counterclockwise (in the direction of the arrow V) around a pin 42 provided in the vicinity of a base portion of the sector plate for shielding a light path, and reversely turns for opening the light path.

More concretely, the first shutter 30 turns around the pin 42 through a usual link mechanism (not shown) in accordance with expansion/contraction of a piston rod of the first pneumatic cylinder 34.

The second shutter 32 is composed of a sector plate, which is provided for shielding a light path of a light beam between the light source 12 and a second condenser lens 26. As shown in FIG. 2, the second shutter turns along a plane perpendicular to the paper plane of the drawing counterclockwise (in the direction of the arrow W) around a pin 44 provided in the vicinity of a base portion of the sector plate for shielding a light path, and reversely turns for opening the light path.

More concretely, the second shutter 32 turns around the pin 44 through a usual link mechanism (not shown) in accordance with expansion/contraction of a piston rod of the second pneumatic cylinder 36.

The controller 38 includes a timer (not shown), and solenoid valves 46A, 46B which are opened/closed on the basis of a signal from the timer.

The timer measures an elapsed time since start of the auto-alignment operation by the second optical system 16, and it outputs a signal to the solenoid valves 46A, 46B and to the alarm system when the elapsed time exceeds a preset time.

The solenoid valves 46A, 46B respectively feed pressurized air to the first and second pneumatic cylinders 34, 36 at the time of the start of the auto-alignment operation for turning the first and second shutters 30, 32 so as to open the light paths. On the other hand, the solenoid valves 46A, 46B respectively turn into evacuation on the basis of a signal from the timer to retract the piston rods of the first and second pneumatic cylinders 34, 36 so as to turn the first and second shutters 30, 32 in the directions reversed to the V direction respectively and the W direction, thus shielding the light paths as shown in FIG. 3.

The alarm system 40 has a lamp 48 and a buzzer 50 inside or near the 1:1 projection aligner 10. The lamp 48 lights or flashes on the basis of a signal from the timer, to activate the buzzer 50.

In this embodiment, a reset means is further provided, which is operated after eliminating the cause of the failure of the auto-alignment operation and returns the 1:1 projection aligner 10 into an auto-alignment stand-by state.

The aligner of the present invention, as described above, includes a timer for measuring an elapsed time and outputting a signal after a specified time has elapsed, shutters for shielding light paths of light beams to be irradiated to a wafer, drive units for driving the shutters on the basis of a signal from the timer, and accordingly, in the case of a failure of the auto-alignment operation, the light beam can be forcibly shielded so as to prevent the wafer from being irradiated with the light beam for longer than a specified time.

As a result, it is possible to prevent both unevenness of exposure of a wafer and damage of the aligner.

While a preferred embodiment of the invention has been described using specific terms, such description is for illustrative purposes only, and it is to be understood that changes and variations may be made without departing from the spirit or scope of the following claims.

What is claimed is:

1. An aligner comprising:

a first optical system for irradiating a light beam emitted from a light source to a wafer by way of a mask so as to expose a photoresist film on said wafer;

a means for auto-alignment of said wafer with respect to said mask;

a timer for measuring an elapsed time since a start of said auto-alignment and outputting a signal after an elapse of a predetermined time;

a first shutter for shielding a light path of said first optical system; and a first drive unit for driving said first shutter to close said first shutter on the basis of said signal supplied from said timer.

2. An aligner according to claim 1, wherein said auto-alignment means includes a second optical system for irradiating a light beam emitted from said light source to said wafer so as to allow said light beam to scan an alignment mark provided on said wafer, and a second shutter for shielding a light path of said second optical system and a second drive unit for driving said second shutter.

3. An aligner according to claim 1, further comprising a second optical system, wherein a light beam of said second optical system is emitted from said light source, and said first shutter shields both the light path of said first optical system and the light path of said second optical system.

4. An aligner according to claim 1, further comprising an alarm system for outputting at least one of an acoustic alarm and a visual alarm on the basis of said signal supplied from said timer.

5. An aligner according to claim 1, further comprising a manually actuated reset means for opening said shutter by reset thereof.

6. An aligner comprising:

a first optical system for irradiating a first light beam emitted from a light source to a wafer by way of a mask so as to expose a photoresist film on said wafer;

a first shutter for shielding a light path of said first optical system;

a means for auto-alignment of said wafer with respect to said mask, said auto-alignment means including a second optical system for irradiating a second light beam emitted from said light source to said wafer;

a second shutter for shielding a light path of said second optical system;

a timer for measuring an elapsed time since a start of said auto-alignment and outputting a signal after an elapse of a specified time; and a drive unit for driving said first shutter on the basis of a signal supplied from said timer.

7. An aligner according to claim 6, further comprising an alarm system for outputting at least one of an acoustic alarm and a visual alarm on the basis of said signal supplied from said timer.

8. An aligner according to claim 6, further comprising a reset means for opening said shutters by reset thereof.

9. An aligner according to claim 1, wherein said first shutter is a sector plate.

10. An aligner according to claim 1, wherein said first drive unit comprises a pneumatic cylinder.

11. An aligner according to claim 1, wherein said first optical system comprises:

a condenser lens;

a concave mirror receiving light from said condenser lens; and a convex mirror formed partially on said condenser lens which receives light from said concave mirror.

12. An aligner according to claim 11, wherein said first optical system further comprises a plane mirror receiving light from said convex mirror.

13. An aligner according to claim 1, wherein said means for auto-alignment comprise:

at least one alignment mark disposed on said wafer;

at least one alignment mark disposed on said mask; and a scanning light beam for scanning said at least one mark disposed on said wafer and said at least one mark disposed on said mask;

wherein said at least one alignment mark disposed on said wafer or said mask has a V-shape; and wherein said at least one alignment mark disposed on the other of said wafer or said mask has a V-shape flanked on either side by a line parallel to said V-shape.

14. An aligner according to claim 13, wherein said scanning light beam comes from said light source by way of a second optical system.

* * * * *